United States Patent [19]
Mohd

[11] Patent Number: 5,867,049
[45] Date of Patent: Feb. 2, 1999

[54] ZERO SETUP TIME FLIP FLOP

[75] Inventor: Bassam J. Mohd, Sunnyvale, Calif.

[73] Assignee: Sun Microsystems, Inc., Palo Alto, Calif.

[21] Appl. No.: 754,739

[22] Filed: Nov. 21, 1996

[51] Int. Cl.[6] .................................................. H03K 3/356
[52] U.S. Cl. ........................ 327/200; 327/201; 327/218
[58] Field of Search ..................................... 327/199–201, 327/202, 203, 208–214, 218; 326/93–98

[56] References Cited

U.S. PATENT DOCUMENTS

| | | | |
|---|---|---|---|
| 4,629,909 | 12/1986 | Cameron | 327/212 |
| 5,173,618 | 12/1992 | Eisenstadt | 327/218 |
| 5,281,865 | 1/1994 | Yamashita et al. | 307/279 |
| 5,497,115 | 3/1996 | Millar et al. | 327/211 |

FOREIGN PATENT DOCUMENTS

| | | | |
|---|---|---|---|
| 567716 | 11/1993 | European Pat. Off. | 327/218 |
| 62-71322 | 4/1987 | Japan | 327/211 |
| 1-97008 | 4/1989 | Japan | 327/218 |
| 4-352513 | 12/1992 | Japan | 327/211 |

*Primary Examiner*—Tuan T. Lam
*Attorney, Agent, or Firm*—Forrest Gunnison

[57] ABSTRACT

Circuits and methods for a zero setup time storage element are disclosed. A storage element having a data input terminal, a clock input terminal and a data output terminal is able to capture a logic value of a data signal on the data input terminal with a substantially zero setup time at an active edge of a clock signal. Furthermore, some embodiments of the storage element are able to drive the captured logic value until the next active edge. One embodiment of the storage element includes a control circuit coupled to an output driver circuit. Depending on the state of the data input signal during an active edge, the control circuit can drives a first control signal to the output driver circuit or a second control signal to the output driver circuit. The output driver drives a data output signal on the data output terminal of the storage element based on the values of the control signals.

35 Claims, 13 Drawing Sheets

ZERO SETUP TIME FLIP FLOP

BACKGROUND OF THE INVENTION

1. Field of the Invention

This invention relates generally to storage elements and in particular to preventing violations of the setup time requirement of flip-flops.

2. Description of Related Art

Storage elements, such as latches and flip-flops, are ubiquitous in complex digital circuits. The D-type flip-flop is perhaps the most popular type of storage element. FIG. 1(a) shows the logic diagram of D-type flip-flop 100 having data input terminal D, clock input terminal CLK, data output terminal Q, and inverted data output terminal !Q. Many embodiments of D-type flip-flops, for example CMOS implementations, also have an inverted clock input terminal !CLK (not shown) which receives an inverted clock input signal !CLK. Furthermore, some embodiments of D-type flip-flops do not provide inverted data output terminal !Q. To avoid confusion, signals on the various terminals are given the same names as the terminals themselves, whenever possible. Typically, for D-type flip-flops, rising edges of clock input signal CLK are active edges and falling edges are inactive edges. However, in some circuits falling edges are active edges, and rising edges are inactive edges.

FIG. 1(b) shows the timing diagram of D-type flip-flop 100. On active (rising) edge 110 of clock input signal CLK, D-type flip-flop 100 passes signal V1 on data input terminal D to data output terminal Q, which changes to signal V1 after a time delay T_cq (clock-to-out), representing the propagation delay of D-type flip-flop 100. D-type flip-flop 100 ignores changes to data input signal D, such as the transition from signal V1 to signal V2, until active (rising) edge 120 of clock input signal CLK. At active (rising) edge 120, data input terminal D is receiving signal V3. Therefore, after time delay T_cq, data output signal Q is also signal V3.

For D-type flip-flop 100 to function properly, data input signal D must satisfy two timing constraints, a setup time and a hold time, with respect to active edges of clock input signal CLK. Setup time T_setup is the minimum time that data input signal D must be at the proper signal level before the active clock edge. Hold time T_hold is the minimum time that data input signal D must remain at the proper signal level after the active clock edge. If either the setup time or hold time is violated, data output signal Q of D-type flip-flop 100 is undeterminable.

The D-type flip-flop can be implemented using many well known circuits. The exact details of each implementation are dependent upon the process technology and available semiconductor area. The important characteristics of a D-type flip-flop are given by the timing relationships among the signals on data input terminal D, data output terminal Q, and clock input terminal CLK.

FIG. 2 shows a well known static D-type flip-flop 200 constructed with two transmission gates and four inverters. Data input signal D is coupled to the input terminal of transmission gate 210. Transmission gate 210 is coupled to clock input terminal CLK and inverted clock input terminal !CLK so that transmission gate 210 transmit data only when clock input signal CLK is in an inactive state (a logic low). When a transmission gate is transmitting data, the transmission gate is said to be ON. If the transmission gate is not transmitting data, i.e. if clock input signal CLK is at a logic high for transmission gate 210, the transmission gate is said to be OFF. Inverter 220 and inverter 230 are coupled with transmission gate 210 to form a storage element commonly called a D-type latch. Transmission gate 210 is constructed to provide more driving power, i.e. more current sourcing strength when driving a logic high and more current sinking strength when driving a logic low, than inverter 230. Thus, transmission gate 210 can overpower the signal from the output terminal of inverter 230 and force a new logic state to the input of inverter 220 when transmission gate 210 is ON. When transmission gate 210 is OFF, inverter 230 provides a feedback path so that the signal level on the input terminal of inverter 220 is maintained by the output terminal of inverter 230. Thus inverter 220 and inverter 230 form a storage element for the value of the signal which was driven by transmission gate 210 before transmission gate 210 is turned OFF.

The output terminal of inverter 220 is coupled to the input terminal of transmission gate 240. Transmission gate 240, inverter 250, and inverter 260 form a second D-type latch. However, transmission gate 240 is coupled to clock input terminal CLK and inverted clock input terminal !CLK so that transmission gate 240 is ON when clock input signal CLK is in the active state (a logic high). The functionality of static D-type flip-flop 200 is explained with reference to the timing diagram of FIG. 1(b). Before active (rising) edge 110, clock input signal CLK is at a logic low. Therefore, transmission gate 210 is ON, but transmission gate 240 is off. Data value V1 on data input signal D is transmitted through transmission gate 210 and stored by inverter 220 and inverter 230. Since transmission gate 240 is OFF, data value V1 does not propagate to data output Q of static D-type flip-flop 200 before active edge 110. After active edge 110, clock input signal CLK is at a logic high. Therefore, transmission gate 210 is OFF, and transmission gate 240 is ON. Since inverter 220 and inverter 230 maintains data value V1 at the input terminal of inverter 220, an inverted version of data value V1 is transmitted through transmission gate 240 to the input terminal of inverter 250. Inverter 250 then drives data value V1 to data output terminal Q of static D-type flip-flop 200.

Since transmission gate 210 is off while clock input signal CLK is at a logic high, static D-type flip-flop 200 ignores the transition of data input signal D from data value V1 to data value V2. After inactive (falling) edge 115, transmission gate 210 is ON so that data value V2 is transmitted to inverter 220. However transmission gate 240 is OFF so that inverter 250 is isolated from inverter 220. Therefore, inverter 250 and 260 maintain data value V1 on data output terminal Q, until active edge 120 of clock input signal CLK.

For static D-type flip-flop 200 to function properly, data input signal D must satisfy the setup and hold time constraints of static D-type flip-flop 200. Referring to FIGS. 1(b) and 2, if an inverted copy of data value V1 is not driven by inverter 220 before active edge 110, inverter 230 drives whatever previous data value was being stored by inverter 220 and inverter 230, onto the input terminal of inverter 220. Therefore, inverter 220 may never properly drive an inverted version of data value V1. Accordingly, data value V1 must be present on data input terminal D before an active edge long enough for inverter 220 to drive an inverted copy of data input signal D on the output terminal of inverter 220. Therefore, the set up time for static D-type flip-flop 200 is the worse case propagation delay of transmission gate 210 plus the worse case propagation delay of inverter 220. Similarly, data input signal D should remain valid long enough after an active edge to insure no spurious signals are driven onto the input terminal of inverter 220 by transmission gate 210. Therefore, the hold time of static D-type flip-flop 200 is the worse case propagation delay of transmission gate 210.

Faster flip-flops can be created by using dynamic circuits. Dynamic circuits have two distinct functional periods: a precharge period and an evaluation period. During the precharge period, typically when clock input signal CLK is low, certain nodes within the dynamic circuit are precharged to specific precharged states. During the evaluation period the input signals to the circuit are evaluated to generate the output signals of the circuit by discharging one or more of the precharged nodes. The primary disadvantage of dynamic circuits is that the output signal of the dynamic circuit is not valid during the precharge period.

FIG. 3 shows a well known dynamic D-type flip-flop 300 constructed with three PMOS transistors and three NMOS transistors. Data input signal D is coupled to the gate terminal of PMOS transistor 310 and the gate terminal of NMOS transistor 330. Clock input signal CLK is coupled to the gate terminal of PMOS transistor 320, the gate terminal of PMOS transistor 340, and the gate terminal of NMOS transistor 360. During a precharge period, PMOS transistor 340 precharges data output terminal Q to a logic high state, regardless of the value of data input signal D or the previous value of data output signal Q.

During an evaluation period, if data input signal D is at a logic high, NMOS transistor 330 is ON to pull the signal on node 325 to a logic low. Since node 325 is coupled to the gate terminal of NMOS transistor 350, NMOS transistor 350 is turned OFF during evaluation periods in which data input signal D is at a logic high. Therefore, data output terminal Q is not discharged and remains at a logic high.

If data input signal D is at a logic low prior to the evaluation period, node 325 is pulled to a logic high by PMOS transistor 320 and PMOS transistor 310. The setup time of dynamic D-type flip-flop 300 is determined by the time necessary to precharge node 325 through PMOS transistor 310 and PMOS transistor 320. Since node 325 is at a logic high at the beginning of the next evaluation period, NMOS transistor 350 is turned ON. Therefore, data output terminal Q is discharged to a logic low through NMOS transistor 350 and NMOS transistor 360 at the beginning of the evaluation period when clock input signal CLK is at a logic high. Although dynamic D-type flip-flop 300 has very good setup time characteristics the inability to of dynamic D-type flip-flop 300 to maintain data output signal Q valid for an entire clock period limits the usefulness of dynamic D-type flip-flop 300.

As the frequency of integrated circuits and electronic systems have increased, the time allowed to generate and propagate a signal to the input terminal of a storage element has decreased. Therefore, satisfying long setup time requirements for storage elements is an obstacle to increasing clock frequency and therefore performance of integrated circuits and electronic systems. Hence, there is a need for a storage element with only minimal setup time requirements which provide valid outputs for an entire clock period, i.e. until after the next active edge of the clock input signal.

SUMMARY OF THE INVENTION

In accordance with this invention, circuits and methods are disclosed for a substantially zero setup time storage element. Specifically, a storage element in accordance to the invention is able to capture a logic value of a data input signal on the data input terminal of the storage element at a substantially zero setup time period before a first active edge of a clock input signal on the clock terminal of the storage element. Furthermore, some embodiments of the storage elements are able to drive the captured value until after the next active edge of the clock input signal.

In a storage element in accordance with one embodiment of the invention, a control circuit is coupled to an output driver circuit. The control circuit is coupled to the data input terminal and the clock input terminal. The output driver circuit is coupled to the data output terminal. If the data input signal on the data input terminal is in a first state at an active edge of the clock input signal on the clock input terminal, the control circuit drives a first control signal to a first output driver circuit input terminal of the output driver circuit to cause the output driver circuit to drive the first state on the data output terminal. If the data input signal is in a second state at an active edge of the clock input signal, the control circuit drives a second control signal on a second output driver circuit input terminal of the output driver circuit to cause the output driver circuit to drive the second state on the data output terminal.

In another embodiment of the storage element, the control circuit includes a N-tree circuit to drive the first control signal and a P-tree circuit to drive the second control signal. The N-tree circuit and the P-tree circuit can be coupled together by optional feedback paths so that the P-tree circuit is prevented from driving the second control signal if the N-tree circuit is already driving the first control circuit. Similarly the N-tree circuit is prevented from driving the first control signal if the P-tree circuit is driving the second control signal.

One embodiment of the output driver circuit includes a first output transistors to drive a logic high onto the data output terminal and a second output transistor to drive a logic low onto the data output terminal. Another embodiment of the output driver circuit also includes a first output enable transistors coupled in series with the first output transistor and a second output enable transistor coupled in series with the second output transistor. The output enable transistors are used so that only one of the output transistors is able to drive the data output terminal at a time.

Furthermore, some embodiments of the storage element in accordance with the invention, includes a feedback latch coupled to the data output terminal of the storage element. The feedback latch maintains the value driven by the output driver circuit if the output driver circuit enters a high impedance state.

BRIEF DESCRIPTION OF THE DRAWINGS

Herein, objects with the same reference numeral are the same or similar object.

DETAILED DESCRIPTION

According to the principles of this invention, the setup time limitations associated with conventional storage elements are minimized by a novel zero setup time storage element, i.e. a ZS-type storage element. The ZS-type storage element has the functionality of standard storage elements but has a substantially zero setup time requirement. The ZS-type storage element of the invention can replace conventional storage elements without requiring modification of surrounding circuits.

Figure 1A:
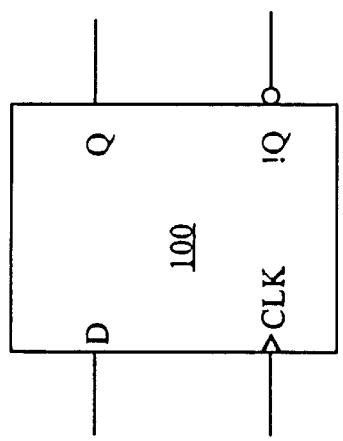
FIGS. 1(a) and 1(b) show a logic symbol and a timing diagram of the D-type flip-flop, respectively.
Figure 1B:
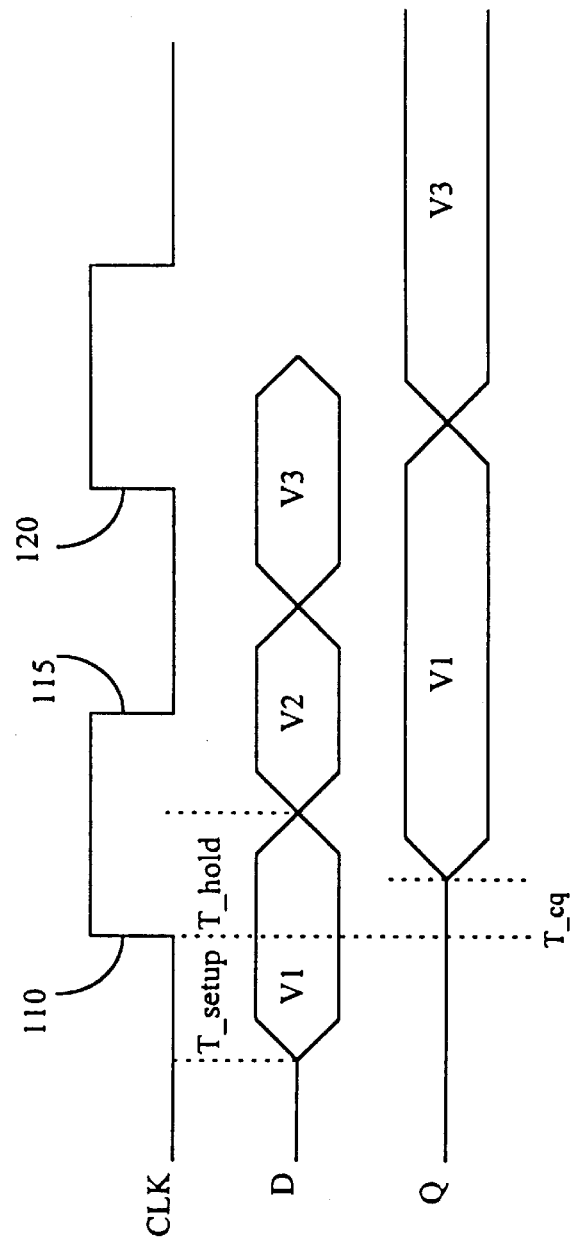
Figure 2:
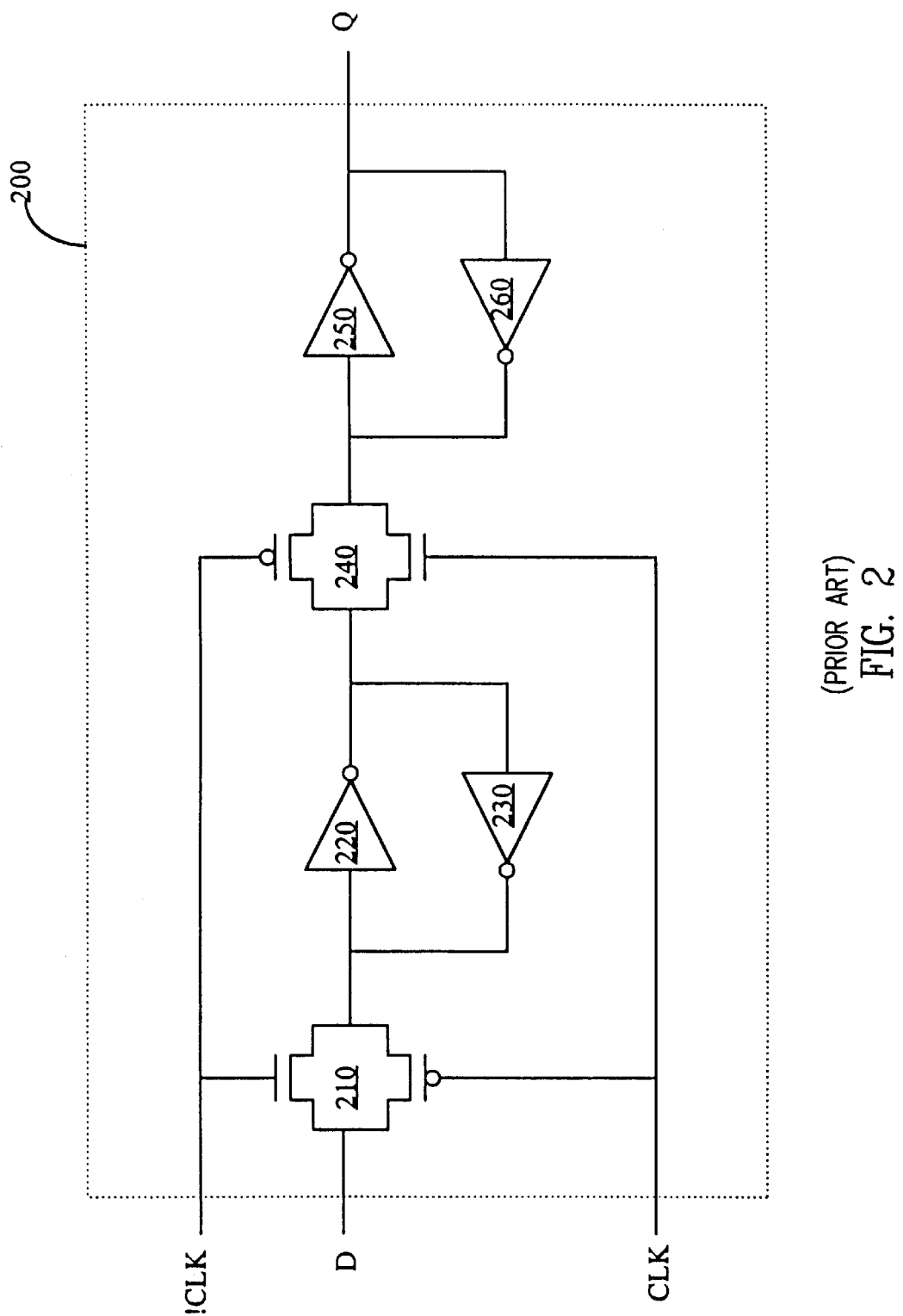
FIG. 2 shows a circuit diagram of a static the D-type flip-flop.
Figure 4:
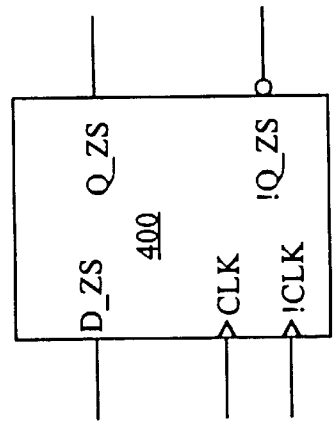
FIG. 4 shows a logic symbol for a DZS-type flip-flop.
Figure 3:
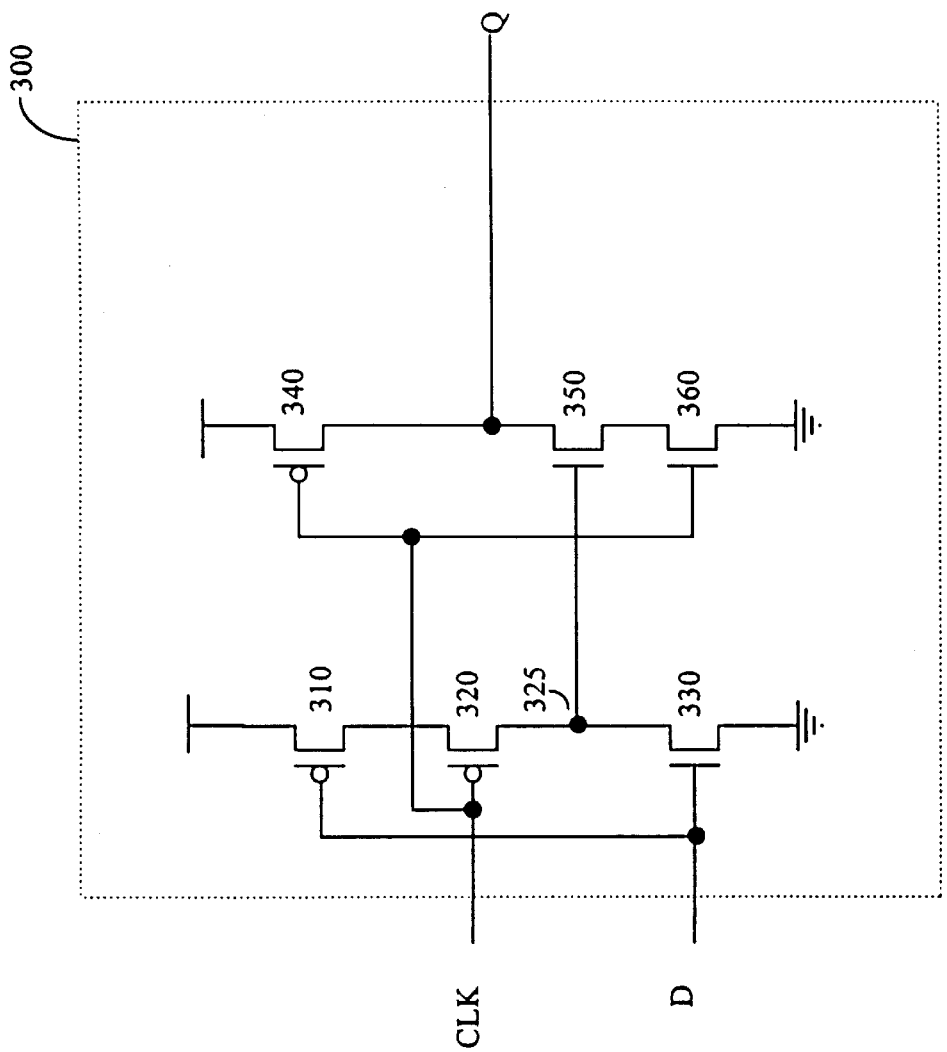
FIG. 3 shows a circuit diagram of a dynamic D-type flip-flop.

FIG. 4 shows a logic symbol for a ZS-type storage element, i.e. a DZS-type flip-flop 400, which has the functionality of a D-type flip-flop with a substantially zero setup time requirement. DZS-type flip-flop 400 includes data input terminal D_ZS, clock input terminal CLK, inverted clock input terminal !CLK, data output terminal Q, and inverted data output terminal !Q_ZS. To avoid confusion, the signals on the various terminals are called by the same name as the terminals. In some embodiments of DZS-type flip-flop 400, inverted clock input terminal !CLK is not required. For example, one embodiment of DZS-type flip-flop 400 generates an inverted clock input signal internally by providing clock input signal CLK to an internal inverter. In addition some embodiments of DZS-type flip-flop 400 do not provide inverted data output terminal !Q_ZS.

Figure 5A:
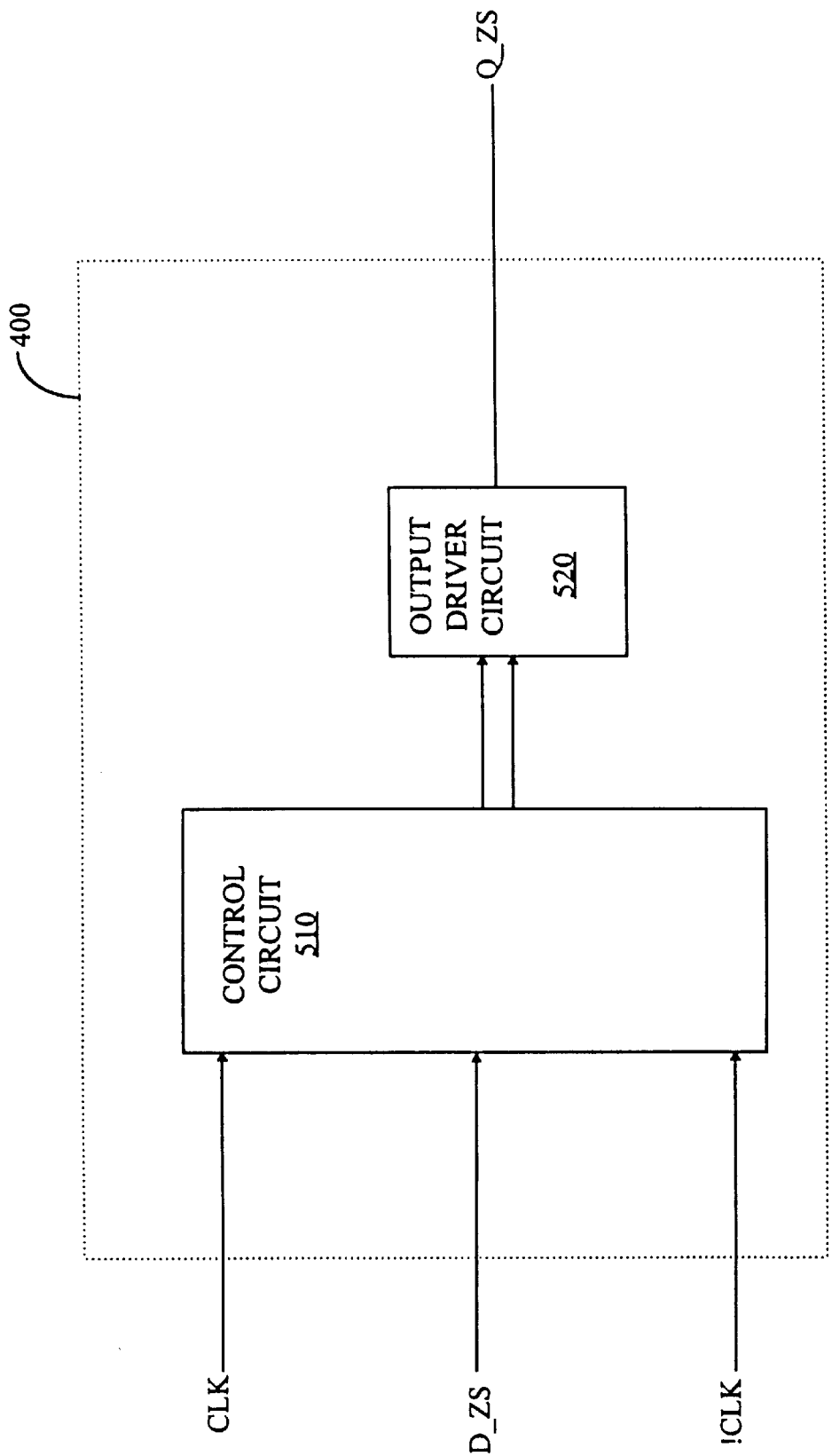
FIG. 5(a) shows a block diagram of a DZS-type flip-flop in accordance with one embodiment of the invention.

FIG. 5(a) shows a block diagram of one embodiment of DZS-type flip-flop 400. An output terminal of output driver circuit 520 drives data output terminal Q_ZS. Output driver circuit 520 is controlled by control signals from control circuit 510. Control circuit 510 receives the signal on clock input terminal CLK as an input signal, i.e. Control circuit 510 is coupled to clock input terminal CLK. Control circuit 510 is also coupled to data input terminal D and inverted clock input terminal !CLK. Some embodiments of control circuit 510 are not coupled to both clock input signal CLK and inverted clock input signal !CLK.

In one embodiment of DZS-type flip-flop 400, control circuit 510 causes output driver circuit 520 to drive a logic high, if data input signal D_ZS is at a logic high at an active (rising) edge of clock input signal CLK. Conversely, control circuit 510 causes output driver circuit 520 to drive a logic low, if data input signal D_ZS is at a logic low at an active (rising) edge of clock input signal CLK. Of course other embodiments of DZS-type flip-flop 400 may use other polarities. Typically, control circuit 510 uses a first control signal to cause output driver circuit 520 to drive a logic low, and a second control signal to cause output driver circuit 520 to drive a logic high.

Figure 5B:
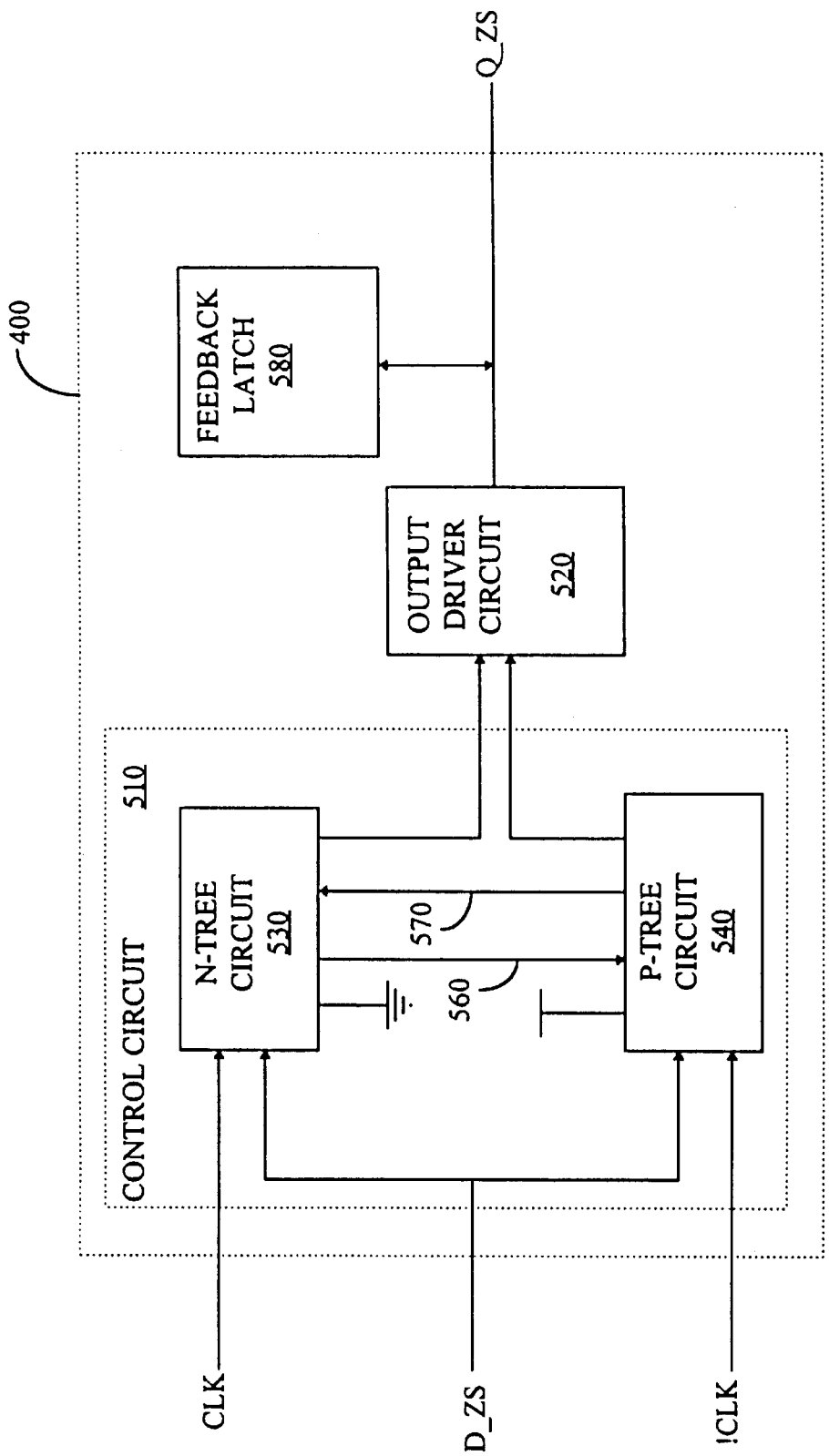
FIG. 5(b) shows a detailed block diagram of a DZS-type flip-flop in accordance with one embodiment of the invention.

FIG. 5(b) shows a detailed block diagram of another embodiment of DZS-type flip-flop 400, in which control circuit 510 contains an N-tree circuit 530 and a P-tree circuit 540. An output terminal of output driver circuit 520 drives data output terminal Q_ZS. Output driver circuit 520 is controlled by control signals from N-tree circuit 530 and P-tree circuit 540. In the embodiment of FIG. 5(b), N-tree circuit 530 is coupled to clock input terminal CLK. However, in other embodiments N-tree circuit 530 is coupled to inverted clock input terminal !CLK. Still other embodiments have N-tree circuit 530 coupled to both clock input terminal CLK and inverted clock input terminal !CLK. Similarly, in various embodiments of DZS-type flip-flop 400, P-tree circuit 540 receives the signal on either clock input terminal CLK, inverted clock input terminal !CLK, or both clock input terminals as an input signal, i.e. P-tree circuit 540 is coupled to either clock input terminal CLK, inverted clock input terminal !CLK, or both clock input terminals.

In most embodiments of DZS-type flip-flop 400, both N-tree circuit 530 and P-tree circuit 540 use dynamic clocking schemes. Specifically, N-tree circuit 530 and P-tree circuit 540 are set to specific precharge states during a precharge period when clock input signal CLK is in an inactive state (typically a logic low). During an evaluation period, when clock input signal CLK is in an active state (typically a logic high), N-tree circuit 530 and P-tree circuit 540 transition to evaluated states based on the binary value of data input signal D_ZS on data input terminal D_ZS.

In one embodiment of DZS-type flip-flop 400, N-tree circuit 530 causes output driver circuit 520 to drive a logic high, if data input signal D_ZS is at a logic high at the beginning of the evaluation period by driving a first control signal to a first output driver circuit input terminal. Conversely, P-tree circuit 530 causes output driver circuit 520 to drive a logic low, if data input signal D_ZS is at a logic low at the beginning of the evaluation period by driving a second control signal to a second output driver circuit input terminal. Of course other embodiments of DZS-type flip-flop 400 may use other polarities.

In some embodiments of DZS-type flip-flop 400, N-tree circuit 530 and P-tree circuit 540 are cross coupled by optional feedback paths 560 and 570. Specifically, if N-tree circuit 530 transitions from the precharge state of N-tree circuit 530 to the evaluated state of N-tree circuit 530, feedback path 560 prevents the transition of P-tree circuit 540 from the precharge state of P-tree circuit 540 to the evaluated state of P-tree circuit 540. Similarly, if P-tree circuit 540 transitions from the precharge state of P-tree circuit 540 to the evaluated state of P-tree circuit 540, feedback path 570 prevents the transition of N-tree circuit 530 from the precharge state of N-tree circuit 530 to the evaluated state of N-tree circuit 530.

Since, some embodiments DZS-type flip-flop 400 use dynamic clock timing, data output signal $Q_{13}$ ZS might not be valid during precharge periods. In addition, in some embodiments output driver circuit 520 may enter a high impedance state during precharge periods. To eliminate these problems, feedback latch 580 is coupled to data output terminal $Q_{13}$ ZS. As DZS-type flip-flop 400 enters a precharge period, feedback latch 580 latches the value on data output terminal $Q_{13}$ ZS. During the precharge period feedback latch 580 drives the stored value onto data output terminal $Q_{13}$ ZS. However, during evaluation periods, feedback latch 580 enters a high impedance state so that feedback latch 580 does not interfere with output driver circuit 520. Alternatively, feedback latch 580 is made with low power drive so that output driver circuit 520 can overpower feedback latch 580.

Figure 6:
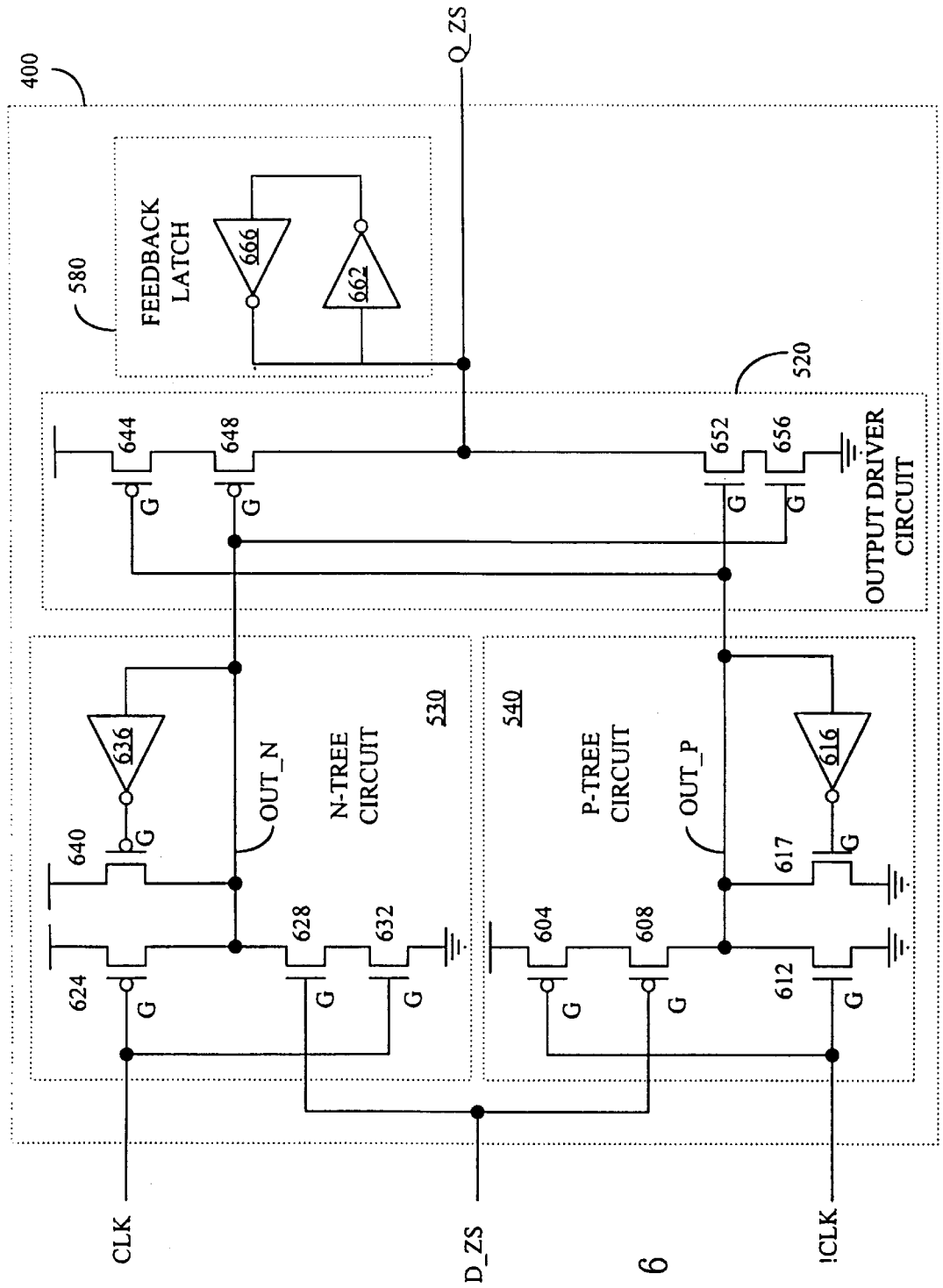
FIG. 6 shows a circuit diagram of a DZS-type flip-flop in accordance with one embodiment of the invention.

FIG. 6 shows a detailed circuit diagram of one embodiment of DZS-flip-flop 400. P-tree circuit 540 includes a precharge NMOS transistor 612 which is coupled between ground, i.e. a first reference voltage, and an output node $OUT_{13}$ P of P-tree circuit 540. During precharge periods, precharge NMOS transistor 612 drives output signal $OUT_{13}$ P on output node $OUT_{13}$ P to a logic low, since the control terminal, i.e. gate terminal G, of precharge NMOS transistor 612 is coupled to inverted clock input terminal !CLK, which is at a logic high during precharge periods. An input enable PMOS transistor 604 and input PMOS transistor 608 are coupled in series between output node $OUT_{13}$ P and the positive power supply, i.e. the second reference voltage. A control terminal, i.e. gate terminal G, of input enable PMOS transistor 604, is coupled to the inverted clock input terminal !CLK so that input enable PMOS transistor 604 is ON, i.e. in a conducting state, only during the evaluation period, i.e. when clock input signal CLK is at a logic high and inverted clock input signal !CLK is at a logic low. A gate terminal G of input PMOS transistor 608 is coupled to data input terminal D__ZS. Thus, if data input signal D__ZS is at a logic low during the evaluation period, input enable PMOS transistor 604 and input PMOS transistor 608 pull output signal $OUT_{13}$ P on output node $OUT_{13}$ P to a logic high.

Inverter 616 and anti-leakage NMOS transistor 617 maintain output signal $OUT_{13}$ P on output node $OUT_{13}$ P by preventing leakage currents from erroneously charging output signal $OUT_{13}$ P on output node $OUT_{13}$ P. In addition inverter 616 and anti-leakage NMOS transistor 617 prevent transient noise on output node $OUT_{13}$ P from erroneously charging output signal $OUT_{13}$ P on output node $OUT_{13}$ P to a logic high. If leakage currents and noise are not a problem inverter 616 and anti-leakage NMOS transistor 617 can be omitted from P-tree circuit 540.

The embodiment of FIG. 6 uses an embodiment of N-tree circuit 530 which is essentially a mirror image of the embodiment of P-tree circuit 540 in FIG. 6. Specifically, precharge PMOS transistor 624 is coupled between and the positive power supply, i.e. the second reference voltage, and an output node OUT__N of N-tree circuit 530. Since, gate terminal G of precharge PMOS transistor 624 is coupled to clock input terminal CLK, precharge PMOS transistor 624 pulls output signal $OUT_{13}$ N on output node $OUT_{13}$ N to a logic high during the precharge periods. An input enable NMOS transistor 632 and input NMOS transistor 628 are coupled in series between ground, i.e. the first reference voltage and output node $OUT_{13}$ N. A gate terminal G of input enable NMOS transistor 632 is coupled clock input terminal CLK so that output node $OUT_{13}$ N can only be discharged during evaluation periods.

Gate terminal G of input NMOS transistor 628 is coupled to data input terminal D__ZS so that if data input signal D__ZS is at a logic high during an evaluation period, output node $OUT_{13}$ N is discharged to a logic low by input NMOS transistor 628 and input enable NMOS transistor 632. Inverter 636 and anti-leakage PMOS transistor 640 prevents leakage currents and noise on output node $OUT_{13}$ N from erroneously discharging output node $OUT_{13}$ N.

The embodiment of FIG. 6 uses a four transistor implementation of output driver circuit 520. Specifically, output enable PMOS transistor 644 and output PMOS transistor 648 are coupled in series between data output terminal $Q_{13}$ ZS and the positive power supply. An output enable NMOS transistor 656 and output NMOS transistor 652 are coupled in series between data output terminal $Q_{13}$ ZS and ground. The gate terminals of both output enable PMOS transistor 644 and output NMOS transistor 652 are coupled to output node $OUT_{13}$ P of P-tree circuit 540. Similarly, the gate terminals of both output PMOS transistor 648 and output enable NMOS transistor 656 are coupled to output node $OUT_{13}$ N of N-tree circuit 530.

During precharge periods, output signal $OUT_{13}$ N on output node $OUT_{13}$ N is pulled to a logic high. Therefore, output PMOS transistor 648 is OFF, i.e. nonconducting, while output enable NMOS transistor 656 is ON, i.e. conducting. Output signal $OUT_{13}$ P on output node $OUT_{13}$ P is pulled to a logic low during precharge periods. Therefore, output enable PMOS transistor 644 is ON, but output NMOS transistor 652 is OFF. Consequently, during precharge periods output driver circuit 520 is in a high impedance state. If a high impedance state on data output terminal $Q_{13}$ ZS is problematic, feedback latch 580 is coupled to data output terminal $Q_{13}$ ZS. The embodiment of FIG. 6, uses a standard dual inverter storage element to hold the value of data output $Q_{13}$ ZS during precharge periods. Specifically, an input terminal of inverter 662 is coupled to data output terminal $Q_{13}$ ZS and to an output terminal of inverter 666. An output terminal of inverter 662 is coupled to an input terminal of inverter 666. Inverter 666 should have weak driving power so that during evaluation periods output driver circuit 520 can overpower inverter 666.

Figure 7A:
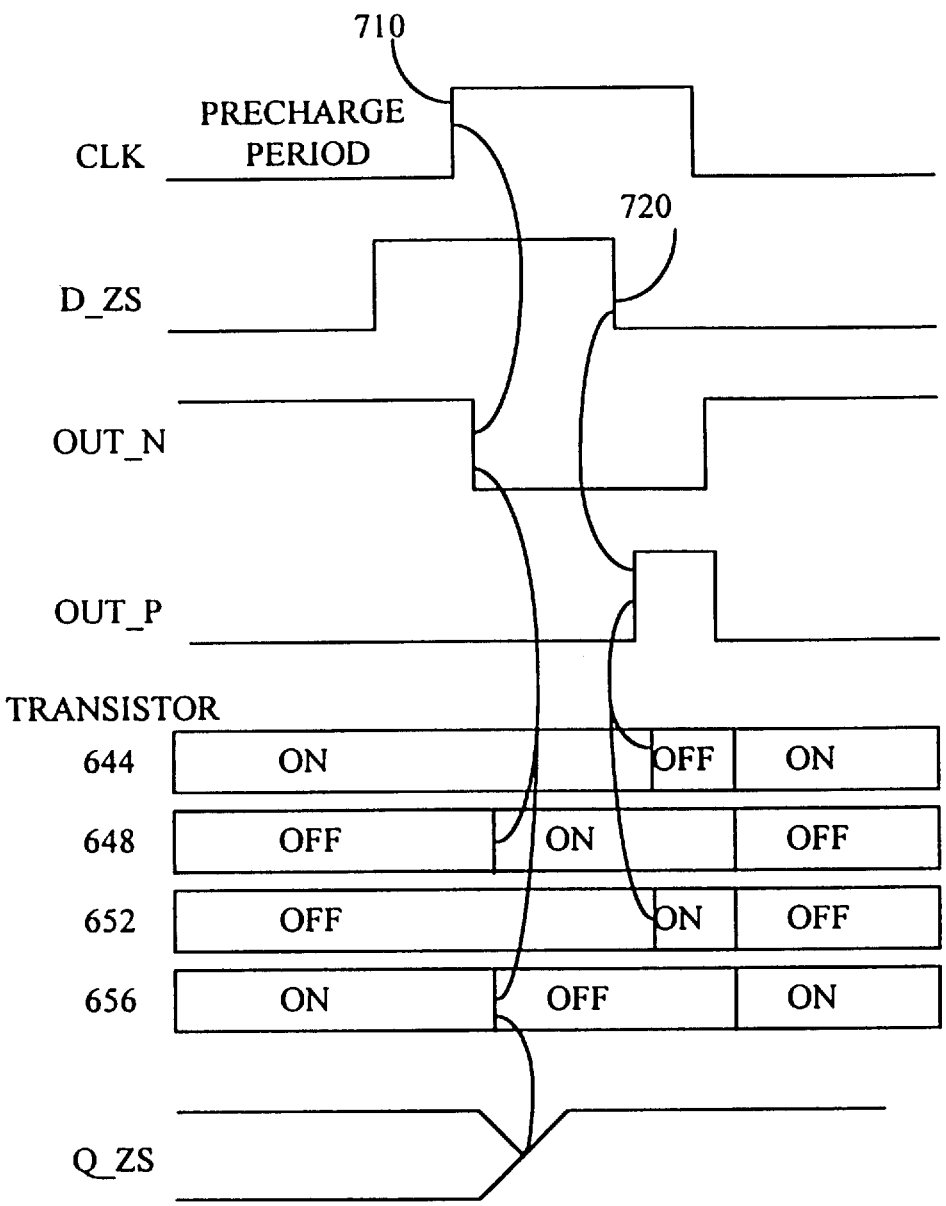
FIGS. 7(a) and 7(b) show timing diagrams for the circuit of FIG. 6.

FIG. 7(a) is a timing diagram for the embodiment of FIG. 6 when data input signal D__ZS is at a logic high at active (rising) edge 710 of clock input signal CLK. Prior to active edge 710, i.e. during a precharge period, precharge PMOS transistor 624 pulls output signal $OUT_{13}$ N on output node $OUT_{13}$ N to a logic high, and precharge NMOS transistor 612 pulls output signal $OUT_{13}$ P on output node $OUT_{13}$ P to a logic low. For convenience, FIG. 7(a) also shows the state of transistors 644, 648, 652, and 656 in output driver circuit 520. Specifically, during the precharge period prior to active edge 710, output enable PMOS transistor 644 is ON, output PMOS transistor 648 is OFF, output NMOS transistor 652 is OFF, and output enable NMOS transistor 656 is ON. The state of data output signal $Q_{13}$ ZS is driven by feedback latch 580 and does not alter the functionality of the other circuits.

After active edge 710, output signal $OUT_{13}$ N on output node $OUT_{13}$ N transitions to a logic low since both input NMOS transistor 628 and input enable NMOS transistor 632 are ON. The transition of output signal $OUT_{13}$ N on output node $OUT_{13}$ N from a logic high to a logic low causes output PMOS transistor 648 to turn ON and output enable NMOS transistor 656 to turn OFF. Since both output enable PMOS transistor 644 and output PMOS transistor 648 are ON, data output node $Q_{13}$ ZS is pulled to a logic high.

When data output signal D__ZS transitions to a logic low at falling edge 720, output signal $OUT_{13}$ P on output node $OUT_{13}$ P is pulled to a logic high. The transition of output signal $OUT_{13}$ P on output node $OUT_{13}$ P to a logic high causes output enable PMOS transistor 644 to turn off and output NMOS transistor 652 to turn on. However, since output enable NMOS transistor 656 is turned off data output terminal $Q_{13}$ ZS is not pulled to a logic low by output NMOS transistor 652. However, since output enable PMOS transistor 644 is turned off, output driver circuit 520 is placed into high impedance state. Therefore, data output terminal $Q_{13}$ ZS is maintained at a logic high by feedback latch 580. If feedback latch 580 is not used, data output terminal $Q_{13}$ ZS remains at a logic high until leakage currents discharges data output terminal Q__ZS.

Figure 7B:
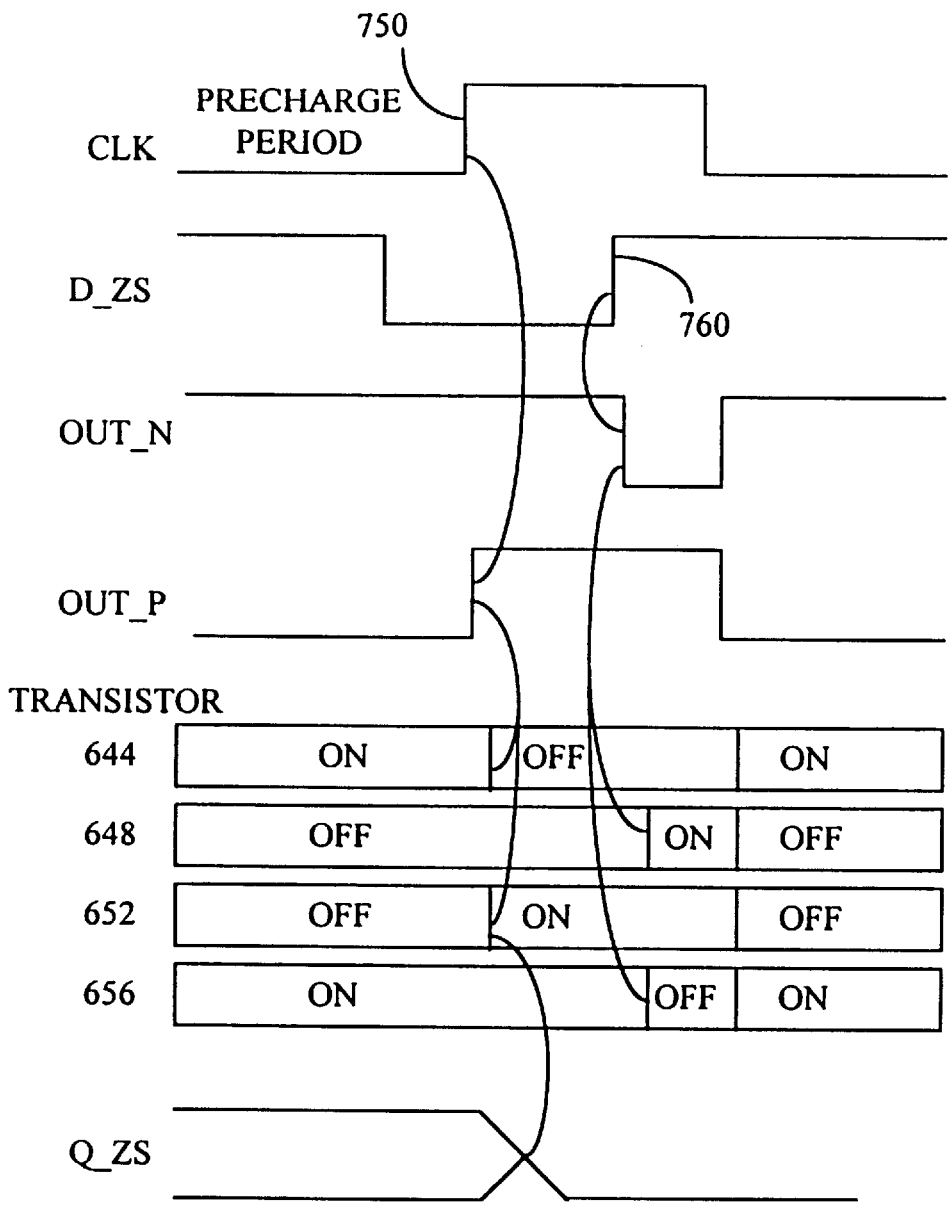

FIG. 7(b) is a timing diagram for the embodiment of FIG. 5(b) when data input signal D__ZS is at a logic low at active (rising) edge 750 of clock input signal CLK. Prior to active edge 750, i.e. during a precharge period, precharge PMOS transistor 624 pulls output signal $OUT_{13}$ N on output node $OUT_{13}$ N to a logic high, and precharge NMOS transistor 612 pulls output signal $OUT_{13}$ P on output node $OUT_{13}$ P to a logic low. For convenience, FIG. 7(b) also shows the state of transistors 644, 648, 652, and 656 in output driver circuit 520. Specifically, during the precharge period prior to active edge 750, output enable PMOS transistor 644 is ON, output PMOS transistor 648 is OFF, output NMOS transistor 652 is OFF, and output enable NMOS transistor 656 is ON. The state of data output signal $Q_{13}$ ZS is driven by feedback latch 580 and does not alter the functionality of the other circuits.

After active edge 750, output signal $OUT_{13}$ P on output node $OUT_{13}$ P transitions to a logic high since both input enable PMOS transistor 604 and input PMOS transistor 608 are ON. The transition of output signal $OUT_{13}$ P on output node $OUT_{13}$ P from a logic low to a logic high causes output enable PMOS transistor 644 to turn OFF and output NMOS transistor 652 to turn ON. Since both output NMOS transistor 652 and output enable NMOS transistor 656 are ON, data output node $Q_{13}$ ZS is pulled to a logic low.

When data output signal D_ZS transitions to a logic high, at rising edge 760, output signal $OUT_{13}$ N on output node $OUT_{13}$ N is pulled to a logic low. The transition of output signal $OUT_{13}$ N on output node $OUT_{13}$ N to a logic low causes output enable NMOS transistor 656 to turn OFF and output PMOS transistor 648 to turn ON. However, since output enable PMOS transistor 644 is turned OFF data output terminal $Q_{13}$ ZS is not pulled to a logic high by output PMOS transistor 648. However, since output enable NMOS transistor 656 is turned OFF, output driver circuit 520 is placed into high impedance state. Therefore, data output terminal $Q_{13}$ ZS is maintained at a logic low by feedback latch 580. Even if feedback latch 580 is not used, data output terminal $Q_{13}$ ZS remains at a logic low until an evaluation period where data input signal D_ZS is at a logic high. Thus, DZS-type flip-flop 400 is able to capture the logic value of data input signal D_ZS at a substantially zero setup time period before a first active edge of clock input signal CLK. Furthermore, by incorporating feedback latch 580, DZS-type flip-flop 400 is able to drive the logic value until after a second active edge of clock input signal CLK.

The primary advantage of the embodiment of DZS-type flip-flip 400 in FIG. 6 is a substantially zero setup time requirement. Since input enable NMOS transistor 632 and input enable PMOS transistor 604 are both OFF before each rising edge, the consequence of data input signal D_ZS prior to the a rising edge is prevented from altering output node $OUT_{13}$ N and output node $OUT_{13}$ P. Therefore, the value of data input signal D_ZS prior to a rising edge does not alter values in the DZS-type flip-flop of FIG. 6. Consequently, the setup time requirement of the DZS-type flip-flop of FIG. 6 is substantially zero. Even with absolute worse case analysis using unrealistic switching times, i.e. the time for a transistor to switch from ON to OFF or to switch from OFF to ON, for the various transistors, the setup time requirement of the DZS-type flip-flop of FIG. 6 is no greater than the switching time of the input transistors.

The hold time requirement of the embodiment of FIG. 6 is also minimal. As explained above, a logic high on data input terminal D_ZS causes output signal $OUT_{13}$ N on output node $OUT_{13}$ N to transitions to a logic low, the transition of output signal $OUT_{13}$ P on output node $OUT_{13}$ P to a logic low caused by a transition in data input signal D_ZS to a logic low does not alter data output terminal $Q_{13}$ ZS since output enable NMOS transistor 656 is OFF. Similarly, once a logic low on data input terminal D_ZS causes output signal $OUT_{13}$ P on output node $OUT_{13}$ P to transition to a logic high, the transition of output signal $OUT_{13}$ N on output node $OUT_{13}$ N to a logic high caused by a transition of data input signal D_ZS to a logic high does not alter data output terminal $Q_{13}$ ZS since output enable PMOS transistor 644 is OFF. Therefore, once either output signal $OUT_{13}$ P on output node $OUT_{13}$ P or output signal $OUT_{13}$ N on output node $OUT_{13}$ N transitions data input signal D_ZS can change values without altering data output signal $Q_{13}$ ZS. Consequently, the hold time requirement of the embodiment of FIG. 6 is the time required to charge output node $OUT_{13}$ P or discharge output node $OUT_{13}$ N. In either case the hold time is only the propagation delay through two transistors, i.e. input NMOS transistor 628 with input enable NMOS transistor 632 or input PMOS transistor 608 with input enable PMOS transistor 604.

Figure 8:
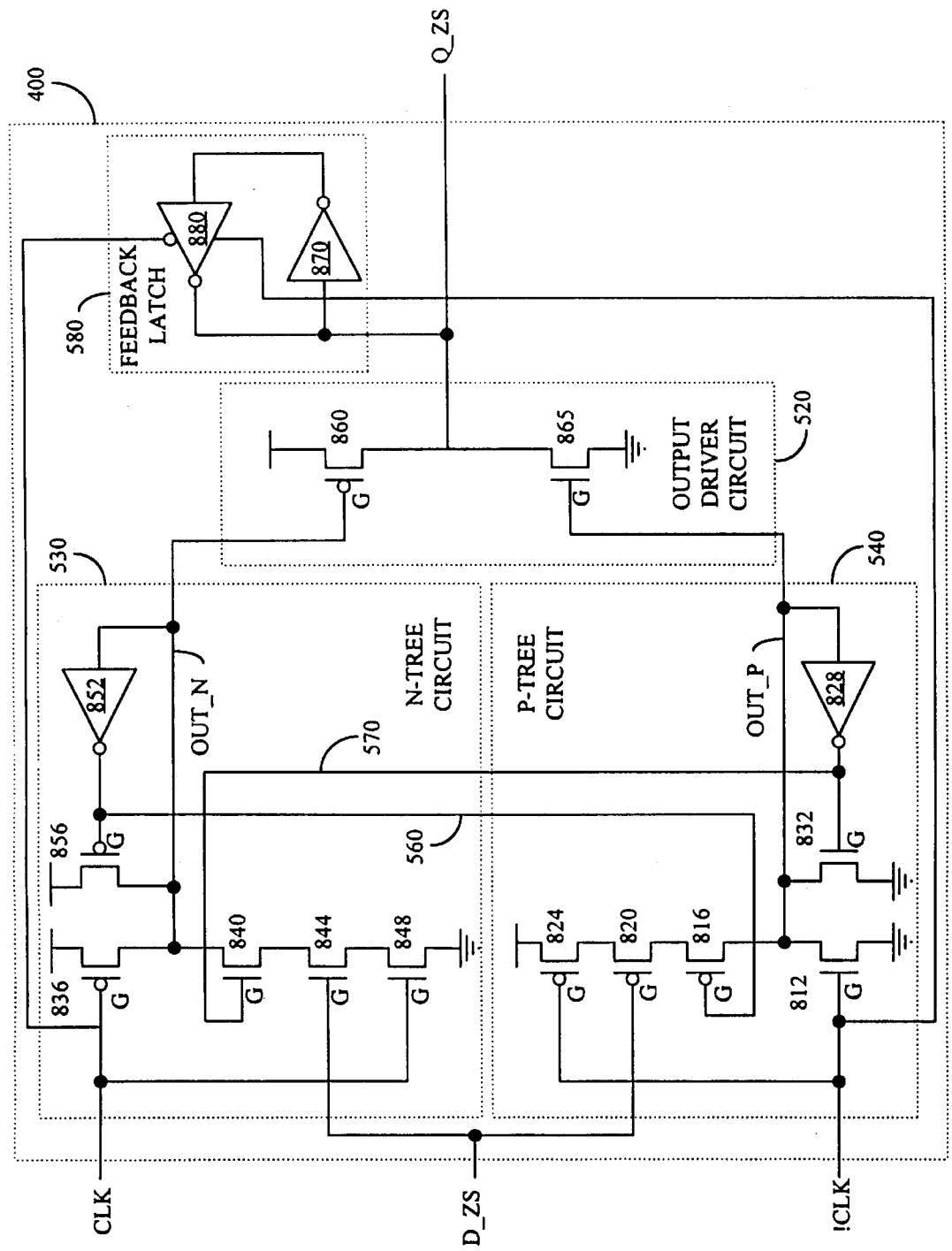
FIG. 8 shows a circuit diagram of a DZS-type flip-flop in accordance with one embodiment of the invention.

FIG. 8 shows a detailed circuit diagram of a second embodiment of DZS-type flip-flop 400. P-tree circuit 540 includes a precharge NMOS transistor 812, which is coupled between ground, i.e. the first reference voltage, and an output node $OUT_{13}$ P of P-tree circuit 540. Gate terminal G of precharge NMOS transistor 812 is coupled to inverted clock input terminal !CLK so that during precharge periods precharge NMOS transistor 812 is ON and drives output signal $OUT_{13}$ P on output node $OUT_{13}$ P to a logic low. Feedback PMOS transistor 816, input PMOS transistor 820, and input enable PMOS transistor 824 are coupled in series between the positive power supply, i.e. the second reference voltage, and an output node $OUT_{13}$ P of P-tree circuit 530. Gate terminal G of input enable PMOS transistor 824 is coupled to inverted clock input terminal !CLK so that input enable PMOS transistor 824 is ON, i.e. conducting, only during evaluation periods. Gate terminal G of input PMOS transistor 820 is coupled to data input terminal D_ZS, so that if data input signal D_ZS is at a logic low input PMOS transistor 820 is turned ON.

Gate terminal G of feedback PMOS transistor 816 is coupled to N-tree circuit 530 via feedback path 560. If data input terminal D_ZS is at a logic high at the beginning of an evaluation period feedback PMOS transistor 816 is turned OFF by N-tree circuit 530 to prevent input enable PMOS transistor 824 and input PMOS transistor 820 from pulling output signal $OUT_{13}$ P on output node $OUT_{13}$ P to a logic high.

Inverter 828 and anti-leakage NMOS transistor 832 prevent leakage currents and transient noise on output node $OUT_{13}$ P from erroneously charging output signal $OUT_{13}$ P on output node $OUT_{13}$ P to a logic high. In addition the output terminal of inverter 828 is coupled to gate terminal G of feedback NMOS transistor 840 via feedback path 570. Thus, if output signal $OUT_{13}$ P on output node $OUT_{13}$ P is pulled to a logic high, feedback NMOS transistor 740 is turned OFF to prevent output signal $OUT_{13}$ N on output node $OUT_{13}$ N from being pulled to a logic low.

In the embodiment of FIG. 8, N-tree circuit 530 has a precharge PMOS transistor 836 coupled between the positive power supply, i.e. the second reference voltage and output node $OUT_{13}$ N of N-tree circuit 530. Gate terminal G of precharge PMOS transistor 836 is coupled to clock input terminal CLK so that output signal $OUT_{13}$ P on output node $OUT_{13}$ P is pulled to a logic high during precharge periods.

Feedback NMOS transistor 840, input NMOS transistor 844, and input enable NMOS transistor 848 are coupled in series between ground, i.e. the first reference voltage, and an output node $OUT_{13}$ N of N-tree circuit 530. As explained above, gate terminal G of feedback NMOS transistor 840 is coupled to P-tree circuit 540 via feedback path 570 to prevent the discharge of output signal $OUT_{13}$ N on output node $OUT_{13}$ N to a logic low if output signal $OUT_{13}$ P on output node $OUT_{13}$ P is at a logic high. Gate terminal G of input enable NMOS transistor 848 is coupled to clock input terminal CLK so that output signal $OUT_{13}$ N on output node $OUT_{13}$ N can be pulled to a logic low by input NMOS transistor 844 only during evaluation periods. Gate terminal G of input NMOS transistor 844 is coupled to data input terminal D__ZS. During evaluation periods input NMOS transistor 844 pulls output signal $OUT_{13}$ N on output node $OUT_{13}$ N to a logic low if data input signal D__ZS is at a logic high and feedback NMOS transistor 840 is still ON.

Inverter 852 and anti-leakage PMOS transistor 856 prevent leakage currents and noise on output node $OUT_{13}$ N from erroneously discharging output signal $OUT_{13}$ N on output node $OUT_{13}$ N to a logic low. In addition the output terminal of inverter 852 is coupled to Gate terminal G of feedback PMOS. transistor 816 via feedback path 560. If output signal $OUT_{13}$ N on output node $OUT_{13}$ N is pulled to a logic low, inverter 852 turns feedback PMOS transistor 816 OFF to prevent output signal $OUT_{13}$ P on output node $OUT_{13}$ P from being pulled to a logic high.

The embodiment of FIG. 8 uses a two transistor implementation of output driver circuit 520. Specifically, output PMOS transistor 860 is coupled between data output terminal $Q_{13}$ ZS and the positive power supply. Gate terminal G of output PMOS transistor 860 is coupled to output node $OUT_{13}$ N of N-tree circuit 530. Output NMOS transistor 865 is coupled between data output terminal $Q_{13}$ ZS and ground. Gate terminal G of Output NMOS transistor 865 is coupled to output node $OUT_{13}$ P of P-tree circuit 540.

As explained above, during precharge periods, output signal $OUT_{13}$ N on output node OUT__N is pulled to a logic high. Therefore, output PMOS transistor 860 is OFF i.e. nonconducting. Output signal $OUT_{13}$ P on output node $OUT_{13}$ P is pulled to a logic low during precharge periods. Consequently, output NMOS transistor 865 is OFF. Therefore, during precharge periods output driver circuit 520 is in a high impedance state. If high impedance state on data output terminal $Q_{13}$ ZS is problematic, feedback latch 580 is coupled to data output terminal $Q_{13}$ ZS. The embodiment of feedback latch 580 shown in FIG. 8 uses a storage element formed by inverter 870 and three state inverter 880. Specifically, the input terminal of inverter 870 is coupled to data output terminal $Q_{13}$ ZS and the output terminal of three state inverter 880. The output terminal of inverter 870 is coupled to the input terminal of three state inverter 880. The control terminals of three state inverter 880 are coupled to clock input terminal CLK and inverted clock input terminal !CLK so that three state inverter 880 is in high impedance state during evaluation periods. Thus, three state inverter 880 does not contend with output driver circuit 520 during evaluation periods. During precharge periods three state inverter 880 is activated to function as a normal inverter. Inverter 870 and three state inverter 880 form a storage element to maintain the state of data output terminal $Q_{13}$ ZS during precharge periods.

Figure 9A:
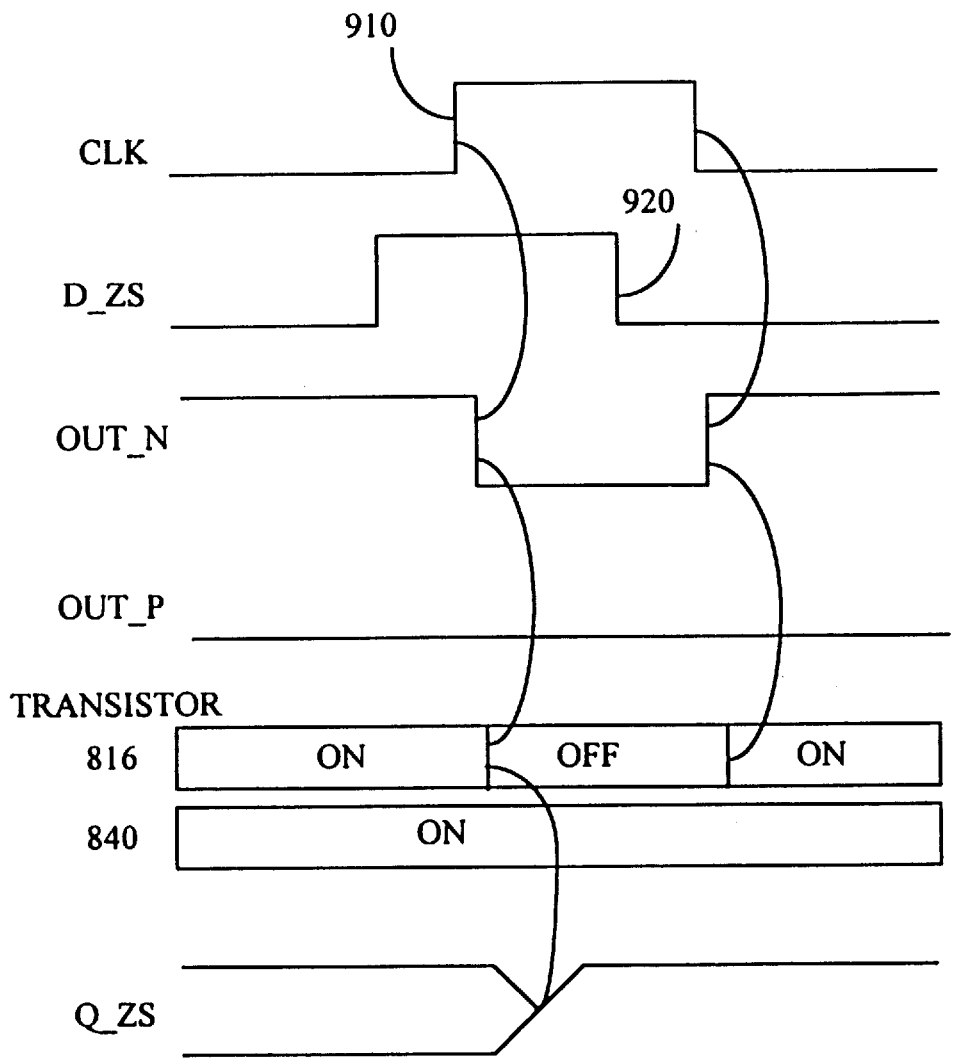
FIGS. 9(a) and 9(b) show timing diagrams for the circuit of FIG. 8.
Figure 9B:
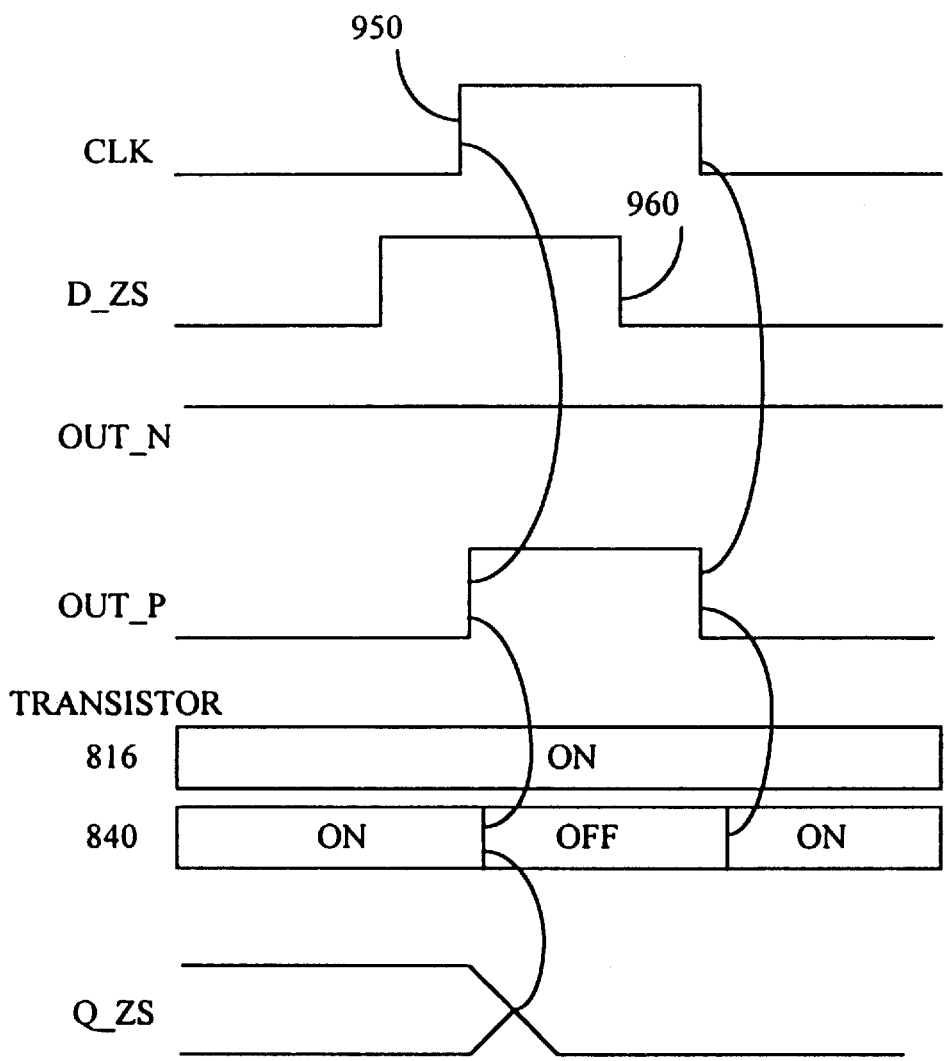

FIG. 9(*a*) is a timing diagram for the embodiment of FIG. 8 when data input signal D__ZS is at a logic high at active (rising) edge 910 of clock input signal CLK. Prior to active edge 910, i.e. during a precharge period, precharge PMOS transistor 836 pulls output signal $OUT_{13}$ N on output node $OUT_{13}$ N to a logic high, and precharge NMOS transistor 812 pulls output signal $OUT_{13}$ P on output node $OUT_{13}$ P to a logic low. For convenience, FIG. 9(*a*) also shows the state of the feedback PMOS transistor 816 and feedback NMOS transistor 840. Specifically, during the precharge period prior to active edge 910, both feedback PMOS transistor 816 and feedback NMOS transistor 840 are ON. The state of data output signal $Q_{13}$ ZS is driven by feedback latch 580 and does not alter the functionality of the other circuits.

After active edge 910, output signal $OUT_{13}$ N on output node $OUT_{13}$ N transitions to a logic low since feedback NMOS transistor 840, input NMOS transistor 844, and input enable NMOS transistor 848 are all ON. The transition of output signal $OUT_{13}$ N on output node $OUT_{13}$ N from a logic high to a logic low causes feedback PMOS transistor 816 to turn OFF and output PMOS transistor 860 to turn ON. Since output PMOS transistor 860 is ON, data output node $Q_{13}$ ZS is pulled to a logic high. When data output signal D__ZS transitions to a logic low at falling edge 920, input PMOS transistor 820 is turned ON. However, feedback transistor 816 is OFF, so output signal $OUT_{13}$ P on output node $OUT_{13}$ P remains at a logic low and output NMOS transistor 865 remains OFF.

FIG. 9(*b*) is a timing diagram for the embodiment of FIG. 8 when data input signal D__ZS is at a logic high at active (rising) edge 950 of clock input signal CLK. Prior to active edge 950, i.e. during a precharge period, precharge PMOS transistor 836 pulls output signal $OUT_{13}$ N on output node $OUT_{13}$ N to a logic high, and precharge NMOS transistor 812 pulls output signal $OUT_{13}$ P on output node $OUT_{13}$ P to a logic low. For convenience, FIG. 9(*b*) also shows the state of the feedback PMOS transistor 816 and feedback NMOS transistor 840. Specifically, during the precharge period prior to active edge 950, both feedback PMOS transistor 816 and feedback NMOS transistor 840 are ON. The state of data output signal $Q_{13}$ ZS is driven by feedback latch 580 and does not alter the functionality of the other circuits.

After active edge 950, output signal $OUT_{13}$ P on output node $OUT_{13}$ P transitions to a logic high since feedback PMOS transistor 816, input PMOS transistor 820, and input enable PMOS transistor 824 are all ON. The transition of output signal $OUT_{13}$ P on output node $OUT_{13}$ P from a logic low to a logic high causes feedback NMOS transistor 840 to turn OFF and output NMOS transistor 865 to turn ON. Since output NMOS transistor 865 is ON, data output node $Q_{13}$ ZS is pulled to a logic low. When data output signal D__ZS transitions to a logic low at rising edge 960, input NMOS transistor 844 is turned ON. However, feedback NMOS transistor 840 is OFF, so output signal $OUT_{13}$ N on output node $OUT_{13}$ N remains at a logic high and output PMOS transistor 860 remains OFF.

Like the embodiment of FIG. 6, the embodiment of FIG. 8 also uses input enable transistors to prevent the input transistors from altering the output nodes until after a rising edge. Therefore, the setup time requirement of the embodiment of FIG. 8 is also practically zero.

The embodiment of FIG. 8 uses feedback NMOS transistor to prevent input NMOS transistor 844 from altering output signal $OUT_{13}$ N on output node $OUT_{13}$ N after output signal $OUT_{13}$ P on output node $OUT_{13}$ P transitions to a logic high. Similarly, feedback PMOS transistor 816 prevents input PMOS transistor 820 from altering output signal $OUT_{13}$ P on output node $OUT_{13}$ P after output signal $OUT_{13}$ N on output node $OUT_{13}$ N has transitioned to a logic low. Therefore, the hold time requirement of the embodiment of FIG. 8 is the discharge time of output signal $OUT_{13}$ P on output node $OUT_{13}$ P or output signal $OUT_{13}$ N on output node $OUT_{13}$ N. In either case, the hold time is equivalent to the propagation time of three transistors plus the propagation delay of an inverter.

Figure 10:
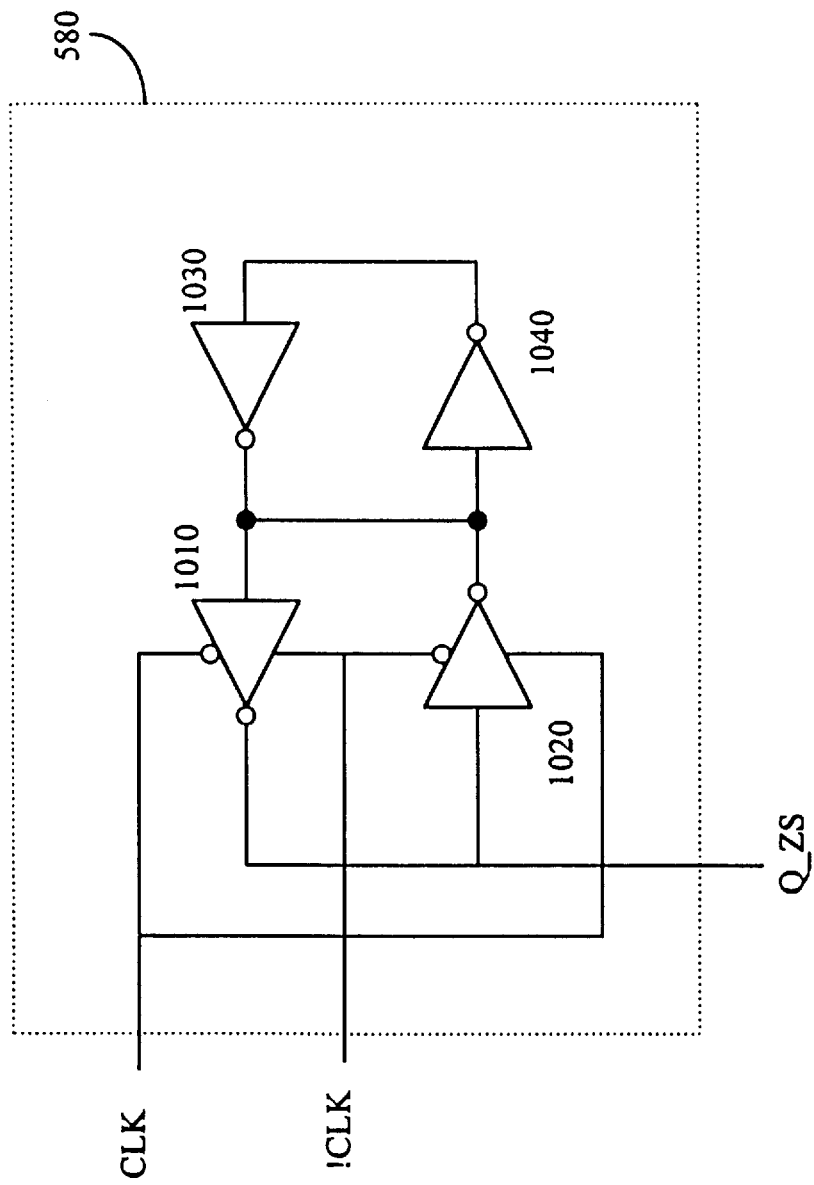
FIG. 10 shows a circuit diagram of a feedback latch in accordance with one embodiment of the invention.

FIG. 10 shows another embodiment of feedback latch 580. The embodiment of FIG. 10 creates an isolated storage element. Specifically, inverter 1030 and inverter 1040 are coupled to form a standard storage element. The input terminal of three state inverter 1010 is coupled to the output terminal of inverter 1030. The output terminal of three state inverter 1020 is coupled to the input terminal of inverter

1040. The output terminal of three state inverter 1010 is coupled to the input terminal of three state inverter 1020 and the input terminal of feedback latch 580.

The control terminals of three state inverter 1010 are coupled to clock input terminal CLK and inverted clock input terminal !CLK so that three state inverter 1010 is in high impedance state during evaluation periods. Conversely, the control terminals of three state inverter 1020 are coupled to clock input terminal CLK and inverted clock input terminal !CLK so that three state inverter 1020 is in high impedance state during precharge periods.

Thus, during evaluation periods the value of data output signal Q_ZS is inverted by three state inverter 1020 and stored by inverter 1030 and 1040. During precharge periods, the storage element formed by inverter 1030 and inverter 1040 is isolated from data output terminal $Q_{13}$ ZS in that the value in the storage element can not be changed by noise on output terminal Q_ZS. However, the value in the storage element is inverted by three state inverter 1010 and driven onto data output terminal $Q_{13}$ ZS during precharge periods so that data output terminal $Q_{13}$ ZS does not enter a high impedance state.

The various embodiments of feedback latch 580, shown in FIGS. 6, 8, and 10 can be used interchangeably with various embodiments of DZS-type flip-flop 400. In addition, other combination and other embodiments of the various circuits can be interchanged. For example, the embodiment of output driver circuit 520 in FIG. 6 can be used in place of the embodiment of output driver circuit 520 in FIG. 8.

Figure 11:
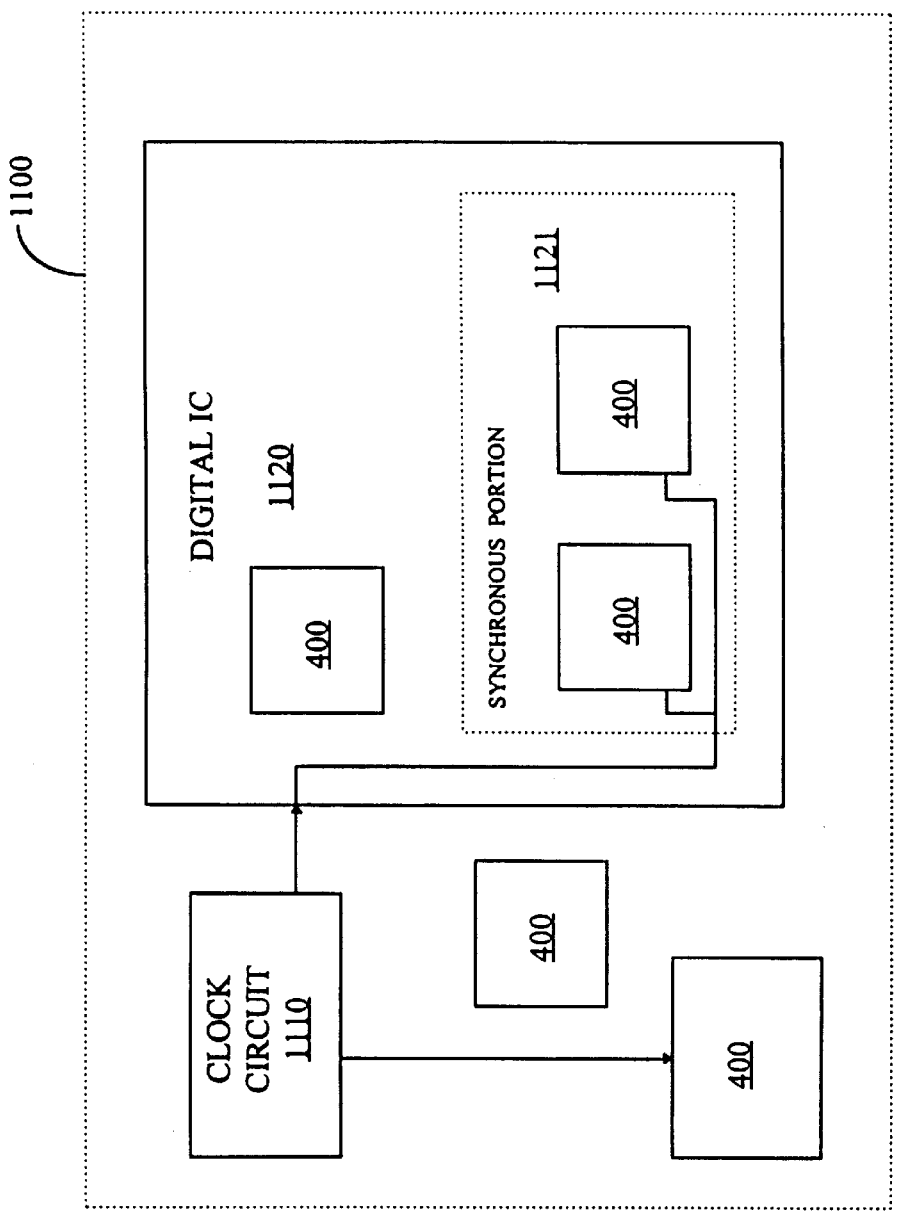
FIG. 11 shows a digital system using storage elements in accordance with one embodiment of the invention.

FIG. 11 illustrates a system using DZS-type flip-flop 400. Typically, DZS-type flip-flop 400 is used in a digital system 1100 having a high speed clock circuit 1110. Digital system 1100 is, for example, a computer workstation, a personal computer, a printer, a monitor, a video card, an audio card, or a storage device. Digital system 1100 contains a digital integrated circuit (IC) 1120, which is for example, a microprocessor, a register, a counter, a graphic IC, an audio IC, or a digital signal processor. Digital IC 1120 can contain one or more instances of DZS-type flip-flop 400. The instances of DZS-type flip-flop 400 in synchronous portion 1121 of Digital IC 1120 are coupled to clock circuit 1110. Other instances of DZS-type flip-flop 400 in Digital IC 1120 are not necessarily coupled to clock circuit 1110. In addition digital system 1100 can also include instances of DZS-type flip-flop 400 on dedicated integrated circuits, which might also be coupled to clock circuit 1110. In addition, DZS-type flip-flop 400 may be used in asynchronous systems which might not include clock circuit 1110.

The various embodiments of the structure and method of this invention that are described above are illustrative only of the principles of this invention and are not intended to limit the scope of the invention to the particular embodiments described. In view of this disclosure, those skilled-in-the-art can define other flip-flop circuits, other feedback latch circuits, other edge conditions, other output driver circuits, other N-tree circuits, other P-tree circuits, other hardware implementations, and use these alternative features to create a method, circuit, or system according to the principles of this invention.

We claim:

1. A storage element comprising:
   a digital data input terminal coupled to receive a data input signal;
   a digital data output terminal;
   a clock input terminal for receiving a clock input signal having a plurality of active edges and a plurality of inactive edges; and wherein said clock input signal is in an active state after each of said active edges, and is in an inactive state after each of said inactive edges;
   an output driver circuit connected to said data output terminal, said output driver circuit having a first output driver circuit input terminal and a second output driver circuit input terminal; and
   a control circuit connected to said data input terminal, said clock input terminal, said first output driver circuit input terminal, and said second output driver circuit input terminal;
   wherein when said data input signal is in a first state during an active edge of said clock input signal, said control circuit drives a first control signal to said first output driver circuit input terminal of said output driver circuit and said output driver circuit drives said first state on said data output terminal; and
   when said data input signal is in a second state during said active edge of said clock input signal, said control circuit drives a second control signal to said second output driver circuit input terminal of said output driver circuit and said output driver circuit drives said second state on said data output terminal, said control circuit further comprises:
   a N-tree circuit connected to said data input terminal, said clock input terminal, and said first output driver circuit input terminal, said N-tree circuit comprising a plurality MOS transistors of a first type; and
   a P-tree circuit connected to said data input terminal and said second output driver circuit input terminal, said P-tree circuit comprising a plurality of MOS transistors of a second type where said second type is different from said first type;
   wherein said N-tree circuit drives said first control signal and said P-tree circuit drives said second control signal.

2. The storage element of claim 1, further comprising an inverted clock input terminal coupled to said P-tree circuit.

3. The storage element of claim 1, wherein said P-tree circuit is coupled to said clock input terminal through an inverter.

4. The storage element of claim 1, further comprising a first feedback path between said N-tree circuit and said P-tree circuit.

5. The storage element of claim 4, further comprising a second feedback path between said N-tree circuit and said P-tree circuit.

6. The storage element of claim 5, wherein said first feedback path prevents said P-tree circuit from driving said second control signal when said N-tree circuit drives said first control signal.

7. The storage element of claim 6, wherein said second feedback path prevents said N-tree circuit from driving said first control signal when said P-tree circuit drives said second control signal.

8. The storage element of claim 1, further comprising a feedback latch connected to said data output terminal.

9. The storage element of claim 8, wherein said feedback latch comprises:
   a first inverter having a first inverter input terminal and a first inverter output terminal, wherein said first inverter input terminal is connected to said data output terminal; and
   a second inverter having a second inverter input terminal and a second inverter output terminal, wherein said second inverter output terminal is connected to said data output terminal and said second inverter input terminal is connected to said first inverter output terminal.

10. The storage element of claim 9, wherein said second inverter is a three state inverter, and wherein said second inverter is in a high impedance state when said clock input signal is in said active state.

11. The storage element of claim 9, wherein said first inverter is a three state inverter, wherein said first inverter is in said high impedance state when said clock input signal is in said inactive state; and wherein said feedback latch further comprises:
a third inverter having a third inverter input terminal and a third inverter output terminal; wherein said third inverter input terminal is connected to said first inverter output terminal; and
a fourth inverter having a fourth inverter input terminal and a fourth inverter output terminal, wherein said fourth inverter input terminal is connected to said third inverter output terminal and wherein said fourth inverter output terminal is connected to both said third inverter input terminal and said second inverter input terminal.

12. The storage element of claim 1, wherein said output driver circuit comprises
a first output transistor coupled between said data output terminal and a positive power supply; and
a second output transistor coupled between said data output terminal and ground.

13. The storage element of claim 12, wherein
a first output transistor control terminal of said first output transistor is coupled to said first output driver circuit input terminal; and
a second output transistor control terminal of said second output transistor is coupled to said second output driver circuit input terminal.

14. The storage element of claim 13, wherein said output driver circuit further comprises:
a first output enable transistor coupled in series with said first output transistor between said data output terminal and said positive power supply; and
a second output enable transistor coupled in series with said second output transistor between said data output terminal and ground.

15. The storage element of claim 14, wherein
a first output enable transistor control terminal of said first output enable transistor is coupled to said second output driver circuit input terminal; and
a second output enable transistor control terminal of said second output enable transistor is coupled to said first output driver circuit input terminal.

16. The storage element of claim 12, wherein said first output transistor is a PMOS transistor and said second output transistor is a NMOS transistor.

17. The storage element of claim 1, wherein said N-tree circuit further comprises:
a precharge transistor coupled between said first output driver circuit input terminal and a positive power supply, said precharge transistor having a precharge transistor control terminal coupled to said clock input terminal; and
wherein said plurality of MOS transistors of said first type includes an input MOS transistor coupled between said first output driver circuit input terminal and ground, said input MOS transistor having an input MOS transistor control terminal coupled to said data input terminal.

18. The storage element of claim 17, wherein said plurality of MOS transistors of said first type in said N-tree circuit further comprises an input enable MOS transistor coupled in series with said input MOS transistor between said first output driver circuit input terminal and ground, said input enable MOS transistor having an input enable MOS transistor control terminal coupled to said clock input terminal.

19. The storage element of claim 18, wherein said plurality of MOS transistors of said first type in said N-tree circuit further comprises a feedback MOS transistor coupled in series with said input MOS transistor and said input enable MOS transistor between said first output driver circuit input terminal and ground, said feedback MOS transistor having a feedback MOS transistor control terminal coupled to said second output driver circuit input terminal through an inverter.

20. The storage element of claim 19, wherein
said precharge transistor is a PMOS transistor; and
said input MOS transistor, said input enable MOS transistor, and said feedback MOS transistor are NMOS transistors.

21. The storage element of claim 17, wherein said N-tree circuit further comprises:
an inverter having an inverter input terminal and an inverter output terminal, wherein said inverter input terminal is coupled to said first output driver circuit input terminal; and
an anti-leakage transistor coupled between said first output driver circuit input terminal and said positive power supply, said anti-leakage transistor having an anti-leakage transistor control terminal coupled to said inverter output terminal.

22. The storage element of claim 2, wherein said P-tree circuit further comprises:
a precharge transistor coupled between said second output driver circuit input terminal and ground, said precharge transistor having a precharge transistor control terminal coupled to said inverted clock input terminal; and
wherein said plurality of MOS transistors of said second type of said P-tree circuit includes:
an input MOS transistor coupled between said second output driver circuit input terminal and a positive power supply, said input MOS transistor having an input transistor control terminal coupled to said data input terminal.

23. The storage element of claim 22, wherein said plurality of MOS transistors of said second type in said P-tree circuit further comprises an input enable MOS transistor coupled in series with said input MOS transistor between said second output driver circuit input terminal and said positive power supply, said input enable MOS transistor having an input enable MOS transistor control terminal coupled to said inverted clock input terminal.

24. The storage element of claim 23, wherein said plurality of MOS transistors of said second type in said P-tree circuit further comprises a feedback MOS transistor coupled in series with said input MOS transistor and said input enable MOS transistor between said second output driver circuit input terminal and said positive power supply, said feedback MOS transistor having a feedback MOS transistor control terminal coupled to said first output driver circuit input terminal through an inverter.

25. The storage element of claim 24, wherein
said precharge transistor is a NMOS transistor; and
said input MOS transistor, said input enable MOS transistor, and said feedback MOS transistor are PMOS transistors.

26. The storage element of claim 22, wherein said P-tree circuit further comprises:
- an inverter having an inverter input terminal and an inverter output terminal, wherein said inverter input terminal is coupled to said second output driver circuit input terminal; and
- an anti-leakage transistor coupled between said second output driver circuit input terminal and ground, said anti-leakage transistor having an anti-leakage transistor control terminal coupled to said inverter output terminal.

27. The storage element of claim 1, wherein said storage element is in a digital system.

28. The storage element of claim 27, wherein said digital system is a workstation.

29. The storage element of claim 1, wherein said storage element is in a microprocessor.

30. A storage element comprising:
- a data input terminal;
- a data output terminal;
- a clock input terminal;
- an inverted clock input terminal;
- a first output transistor coupled between said data output terminal and a positive power supply, said first output transistor having a first output transistor control terminal;
- a second output transistor coupled between said data output terminal and ground; said second output transistor having a second output transistor control terminal;
- a first precharge transistor coupled between said first output transistor control terminal and said positive power supply, said first precharge transistor having a first precharge transistor control terminal coupled to said clock input terminal;
- a second precharge transistor coupled between said second output transistor control terminal and ground, said second precharge transistor having a second precharge transistor control terminal coupled to said inverted clock input terminal;
- a first input transistor coupled between said first output transistor control terminal and ground, said first input transistor having a first input transistor control terminal coupled to said data input terminal; and
- a second input transistor coupled between said second output transistor control terminal and said positive power supply, said second input transistor having a second input transistor control terminal coupled to said data input terminal.

31. The storage element of claim 30, further comprising:
- a first input enable transistor coupled in series with said first input transistor between said first output transistor control terminal and ground, said first input enable transistor having a first input enable transistor control terminal coupled to said clock input terminal; and
- a second input enable transistor coupled in series with said second input transistor between said second output transistor control terminal and said positive power supply, said second input enable transistor having a second input enable transistor control terminal coupled to said inverted clock input terminal.

32. The storage element of claim 31 further comprising:
- a first output enable transistor coupled in series with said first output transistor between said data output terminal and said positive power supply, said first output enable transistor having a first output enable transistor control terminal coupled to said second output transistor control terminal; and
- a second output enable transistor coupled in series with said second output transistor between said data output terminal and ground, said second output enable transistor having a second output enable transistor control terminal coupled to said first output transistor control terminal.

33. The storage element of claim 31 further comprising:
- a first feedback transistor coupled in series with said first input transistor and said first input enable transistor between said first output transistor control terminal and said ground, said first feedback transistor having a first feedback transistor control terminal coupled to said second output transistor control terminal through a first inverter;
- a second feedback transistor coupled in series with said second input transistor and said second input enable transistor between said second output transistor control terminal and said positive power supply, said second feedback transistor having a second feedback transistor control terminal coupled to said first output transistor control terminal through a second inverter.

34. The storage element of claim 31 further comprising:
- a first inverter having a first inverter input terminal and a first inverter output terminal, wherein said first inverter input terminal is coupled to said first output transistor control terminal;
- a first anti-leakage transistor coupled between said first output transistor control terminal and said positive power supply, said first anti-leakage transistor having a first anti-leakage transistor control terminal coupled to said first inverter output terminal;
- a second inverter having a second inverter input terminal and a second inverter output terminal, wherein said second inverter input terminal is coupled to said second output transistor control terminal; and
- a second anti-leakage transistor coupled between said second output transistor control terminal and ground, said second anti-leakage transistor having a second anti-leakage transistor control terminal coupled to said second inverter output terminal.

35. The storage element of claim 31, further comprising a feedback latch coupled to said data output terminal.

* * * * *